United States Patent
Barends

(10) Patent No.: US 11,922,276 B2
(45) Date of Patent: Mar. 5, 2024

(54) SELECTIVE CAPPING TO REDUCE QUANTUM BIT DEPHASING

(71) Applicant: Google LLC, Mountain View, CA (US)

(72) Inventor: Rami Barends, San Diego, CA (US)

(73) Assignee: Google LLC, Mountain View, CA (US)

( * ) Notice: Subject to any disclaimer, the term of this patent is extended or adjusted under 35 U.S.C. 154(b) by 129 days.

(21) Appl. No.: 17/729,999

(22) Filed: Apr. 26, 2022

(65) Prior Publication Data

US 2022/0300846 A1    Sep. 22, 2022

Related U.S. Application Data

(63) Continuation of application No. 16/474,171, filed as application No. PCT/US2017/065369 on Dec. 8, 2017, now Pat. No. 11,348,025.

(60) Provisional application No. 62/440,304, filed on Dec. 29, 2016.

(51) Int. Cl.
  *G06N 10/00* (2022.01)
  *G01R 33/035* (2006.01)
  *H10N 60/80* (2023.01)

(52) U.S. Cl.
  CPC ......... *G06N 10/00* (2019.01); *G01R 33/0354* (2013.01); *H10N 60/805* (2023.02)

(58) Field of Classification Search
  CPC ... G06N 10/00; G01R 33/0354; H10N 60/805
  See application file for complete search history.

(56) References Cited

U.S. PATENT DOCUMENTS

| | | |
|---|---|---|
| 5,574,290 A | 11/1996 | You |
| 8,618,799 B1 | 12/2013 | Radparvar et al. |
| 9,437,800 B1 | 9/2016 | McDermott et al. |
| 2002/0117656 A1 | 8/2002 | Amin et al. |
| 2003/0042481 A1 | 3/2003 | Tzalenchuk et al. |
| 2003/0107033 A1 | 6/2003 | Tzalenchuk |

(Continued)

FOREIGN PATENT DOCUMENTS

| | | |
|---|---|---|
| JP | 2008294167 | 12/2008 |
| KR | 1020040108494 | 12/2004 |
| KR | 1020060106181 | 10/2006 |

(Continued)

OTHER PUBLICATIONS

AU Examination Report in Australian Appln. No. 2017387796, dated Feb. 12, 2020, 3 pages.

(Continued)

*Primary Examiner* — Matthew L Reames
(74) *Attorney, Agent, or Firm* — Fish & Richardson P.C.

(57) ABSTRACT

A device includes: a substrate; a superconducting quantum interference device (SQUID) including a superconductor trace arranged on an upper surface of the substrate and having at least one Josephson junction interrupting a path of the superconductor trace, in which the superconductor trace includes a first superconductor material that exhibits superconducting properties at or below a corresponding superconducting critical temperature; and a dielectric capping layer on an upper surface of the SQUID, in which the dielectric capping layer covers a majority of the superconductor trace of the SQUID, and the capping layer includes an opening through which a first region of the SQUID is exposed, the first region of the SQUID including a first Josephson junction.

15 Claims, 8 Drawing Sheets

(56) References Cited

U.S. PATENT DOCUMENTS

2016/0335559 A1 11/2016 Pereverzev
2017/0065369 A1 3/2017 Bornzin et al.

FOREIGN PATENT DOCUMENTS

WO   WO 2010/099312   9/2010
WO   WO 2016/025598   2/2016

OTHER PUBLICATIONS

AU Notice of Acceptance for Patent Application in Australian Appln. No. 2017387796, dated Aug. 31, 2020, 3 pages.
CA Office Action in Canadian Appln. No. 3047541, dated Jul. 28, 2020, 5 pages.
EP Office Action in European Application No. 17826022, dated Aug. 6, 2019, 3 pages.
JP Office Action in Japanese Appln. No. 2019-535933, dated Oct. 5, 2020, 8 pages (with English Translation).
KR Allowance of Patent in Korean Appln. No. 10-2019-7020243, dated Jan. 25, 2021, 3 pages (with English translation).
KR Office Action in Korean Appln. No. 10-2019-7020243, dated Jul. 27, 2020, 7 pages.
Kumar et al., "Origin and Suppression of 1/f Magnetic Flux Noise and supplement to Magnetic Flux Noise", arXiv, Apr. 4, 2016, 13 pages.
Martinis et al., "Decoherence in Josephson Qubits from Dielectric Loss" Physical Review Letters, Nov. 2005, 4 pages.
Notice of Allowance in Japanese Appln. No. 2019-535933, dated Oct. 4, 2021, 5 pages.
O'Connell et al., "Microwave dielectric loss at single photon energies and millikelvin temperatures" Applied Physics Letters, Mar. 2008, 3 pages.
Office Action in European Appln. No. 17826022.0, dated Nov. 25, 2021, 10 pages.
PCT International Preliminary Report on Patentability in International Application No. PCT/US2017/065369, dated Jul. 2, 2019, 9 pages.
PCT International Search Report and Written Opinion in International Appln No. PCT/US2017/065369, dated Mar. 26, 2018, 16 pages.
Notice of Allowance in Chinese Appln. No. 201780081054.7, dated Feb. 25, 2023, 5 pages (with English translation).
Office Action in European Appln. No. 17826022.0, dated May 17, 2023, 5 pages.
Office Action in Chinese Appln. No. 201780081054.7, dated Sep. 8, 2022, 14 pages (with English translation).

SELECTIVE CAPPING TO REDUCE QUANTUM BIT DEPHASING

CROSS-REFERENCE TO RELATED APPLICATIONS

This application is continuation of U.S. application Ser. No. 16/474,171 filed Jun. 27, 2019, which is a National Stage Application under 35 U.S.C. § 371 and claims the benefit of International Application No. PCT/US2017/065369, filed Dec. 8, 2017, which claims the benefit under 35 U.S.C. § 119(e) of U.S. Provisional Application No. 62/440,304, filed on Dec. 29, 2016. The disclosures of the prior applications are considered part of and are incorporated herein by reference in their entirety.

TECHNICAL FIELD

The present disclosure relates to selective capping to reduce dephasing of quantum bits.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum computing device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

The present disclosure relates to selective capping to reduce dephasing of quantum bits. In general, in some aspects, the inductive part of a quantum bit is partially covered by a capping layer and loss contributed from the presence of the capping layer is reduced.

In general, in some aspects, the subject matter of the present disclosure may be embodied in a device including: a substrate; a superconducting quantum interference device (SQUID) including a superconductor trace arranged on an upper surface of the substrate and having at least one Josephson junction interrupting a path of the superconductor trace, in which the superconductor trace includes a first superconductor material that exhibits superconducting properties at or below a corresponding superconducting critical temperature; and a dielectric capping layer on an upper surface of the SQUID, in which the dielectric capping layer covers a majority of the superconductor trace of the SQUID, and the capping layer includes an opening through which a first region of the SQUID is exposed, the first region of the SQUID including a first Josephson junction.

Implementations of the device may include one or more of the following features. For example, in some implementations, the first region of the SQUID includes a second Josephson junction, and the second Josephson junction is exposed through the opening in the dielectric capping layer.

In some implementations, the SQUID is arranged in a ring, in which the dielectric capping layer includes a first capping layer portion, a second capping layer portion, and a connecting portion connecting the first capping layer portion to the second capping layer portion, and the connecting portion of the dielectric capping layer covers the upper surface of the substrate within an interior region enclosed by the ring.

In some implementations, the connecting portion of the dielectric capping layer covers an entirety of the upper surface of the substrate within the interior region enclosed by the ring. The opening region may include a first section on a first side of the connecting portion and second section on a second opposite side of the connecting portion, in which the first Josephson junction is exposed through the first portion of the opening region, and the SQUID comprises a second Josephson junction that is exposed through the second portion of the opening region.

In some implementations, the SQUID is arranged in a ring, and the upper surface of the substrate within an interior of the ring is exposed through the opening in the dielectric capping layer.

In some implementations, the dielectric capping layer includes a first portion and a second portion separate from the first portion of the dielectric capping layer, and the opening in the dielectric capping layer is located between the first portion of the dielectric capping layer and the second portion of the dielectric capping layer. An entire edge of the first portion of the dielectric capping layer may be separated from an entire edge of the second portion of the dielectric capping layer by a uniform separation distance. An edge of the first portion of the dielectric capping layer and an edge of the second portion of the dielectric capping layer may extend up to but do not cover the first Josephson junction. The device may include a second Josephson junction exposed in the opening in the dielectric capping layer, and the edge of the first portion of the dielectric capping layer and the edge of the second portion of the dielectric capping layer may extend up to but do not cover the second Josephson junction. An edge of the first portion of the dielectric capping layer and an edge of the second portion of the dielectric capping layer may be set back from the first Josephson junction. The device may include a second Josephson junction exposed in the opening in the dielectric capping layer, and the edge of the first portion of the dielectric capping layer and the edge of the second portion of the dielectric capping layer may be set back from the second Josephson junction.

In some implementations, the dielectric capping layer has a non-zero thickness of 1 micron or less extending from a lower surface of the dielectric capping layer to an upper surface of the dielectric capping layer.

In some implementations, the capping layer is silicon oxide, silicon nitride or silicon.

In some implementations, a width of the dielectric capping layer is wider than a width of the superconductor trace such that the dielectric capping layer extends over opposing edges of the superconductor trace. The capping layer may extend over an outer edge of the superconductor trace by no more than about 2 microns.

In some implementations, the SQUID includes: a first section in which the superconductor trace has a first width; a second section in which the superconductor trace has a second width that is less than the first width, in which the second section comprises the first Josephson junction, the dielectric capping layer covers an upper surface of the superconductor trace in the first section, and the upper surface of the superconductor trace in the second section is exposed through the opening in the dielectric capping layer.

In some implementations, the device is a qubit or the SQUID forms part of a qubit.

In some implementations, the substrate is silicon or sapphire.

These and other implementations and aspects may have one or more of the following advantages. For example, in some implementations, the capping layer can reduce dephasing caused by adsorbates. In some implementations, loss may be reduced by forming the opening in the capping layer. In particular, loss may be reduced by locating the opening such that one or more Josephson junctions are exposed through the opening.

The details of one or more embodiments are set forth in the accompanying drawings and the description below. Other features and advantages will be apparent from the description and drawings, and from the claims.

DETAILED DESCRIPTION

Dephasing is a significant barrier to maintaining the coherence of a quantum bit (also referred to as a qubit). Dephasing is a noise process where the phase of a quantum state becomes diffuse. Dephasing is understood to occur from random jumps in the phase or from the accumulation of random phase due to jitter in frequency of the qubit. A potential source of low frequency noise in superconducting qubits includes the spins of atoms and molecules on the surfaces and at the interfaces of an inductive element of the qubit. In many cases, an inductive element of a superconducting qubit includes a superconducting quantum interference device (SQUID). As the spins of the atoms and molecules randomly switch orientation, the magnetic environment of the SQUID changes, resulting in changes in the qubit frequency, and therefore leading to dephasing.

Figure 1:
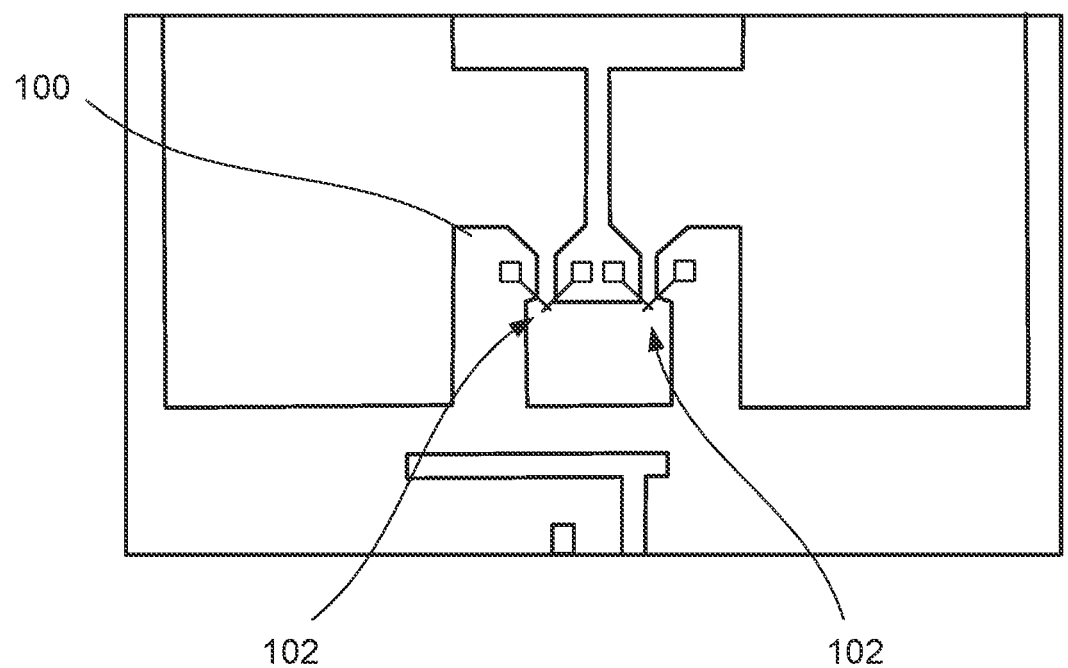
FIG. 1 is a schematic illustrating a top view of an exemplary superconducting interference device (SQUID).

An exemplary SQUID geometry is shown in FIG. 1. The SQUID includes square ring-like structure 100 intersected by two Josephson junctions 102. The ring-like structure 100 is formed from superconductor material, whereas the Josephson junctions are formed from a non-superconductor material, such as a dielectric (e.g., $SiO_x$), interrupting a path of the superconductor trace, or disposed between and in contact with two portions of superconductor material. The structure 100 may be formed on a dielectric substrate, such as silicon or sapphire. SQUIDs, including the SQUIDs disclosed herein, may be used in superconducting qubits, such as fluxmon qubits, transmon qubits, and gmon qubits, among other qubit types.

The surface spin density is thought to arise from a layer of adsorbates on the SQUID's surface. Such adsorbates may include, e.g., water and oxygen, and typically are introduced to the SQUID surface upon removing the qubit device from vacuum during or after fabrication. To reduce dephasing caused by these adsorbates, a high quality dielectric (e.g., relatively low in impurities) may be formed to cap the superconducting material of the SQUID. The high quality dielectric may be formed in-situ, e.g., without removing the qubit from vacuum so that adsorbates do not form at the interface of the SQUID, or ex-situ after an in-situ clean. In this way, once the qubit is removed from vacuum, the adsorbates form on the surface of the capping layer instead of the on the surface of the SQUID. Thus, the adsorbates are located further away from the high magnetic field that is present close to the superconducting surface of the SQUID, leading to a reduction in interference with the magnetic field, and therefore a reduction in dephasing. However, while the dielectric capping layer reduces dephasing, introducing the dielectric also creates a source of microwave energy loss.

The techniques described herein cover methods and devices for reducing the dephasing of circuit elements, such as qubits or planar resonators including co-planar waveguide resonators, without substantially increasing energy loss. In general, the techniques described herein encompass selectively covering the superconductor material of a qubit with a dielectric capping layer, e.g., selectively covering an inductive element of the qubit with a dielectric capping layer. In certain implementations, the techniques described herein cover a device having a substrate and a superconductor trace arranged on the substrate and having at least one Josephson junction interrupting a path of the superconductor trace, in which the superconductor trace includes a first superconductor material that exhibits superconducting properties at or below a corresponding superconducting critical temperature. A dielectric capping layer is formed on the superconductor trace and covers a majority of the superconductor trace up to a first Josephson junction of the at least one Josephson junction. For example, the dielectric capping layer may cover at least half of the area of an upper surface of the superconducting trace (e.g., greater than 50%, greater than 60%, greater than 70%, greater than 80%, or greater than 90%) of the area of the upper surface of the superconducting trace. The first Josephson junction is not covered by the capping layer. Rather, the first Josephson junction may be exposed through an opening in the capping layer. If additional Josephson junctions are included in the pathway of the superconducting trace, one or more of those additional Josephson junctions may also be exposed through the opening in the capping layer.

More particularly, the techniques described herein are directed to selectively providing the dielectric capping layer over areas of the qubit where the magnetic fields are high relative to the electric fields (but low relative to the magnetic fields of the junctions) and leaving other areas, where the magnetic fields are low relative to the electric fields (but high relative to the magnetic fields of other areas of the SQUID), uncovered (e.g., no capping layer is present). This may include, e.g., forming the dielectric capping layer on the portions of the qubit (e.g., portions of the SQUID of the qubit) that include the superconducting material, and leaving the portions of the qubit (e.g., portions of the SQUID of the qubit) that include the Josephson junctions uncovered. By doing this, dielectric layers with realistic, modest loss parameters can be used.

Figure 2A:
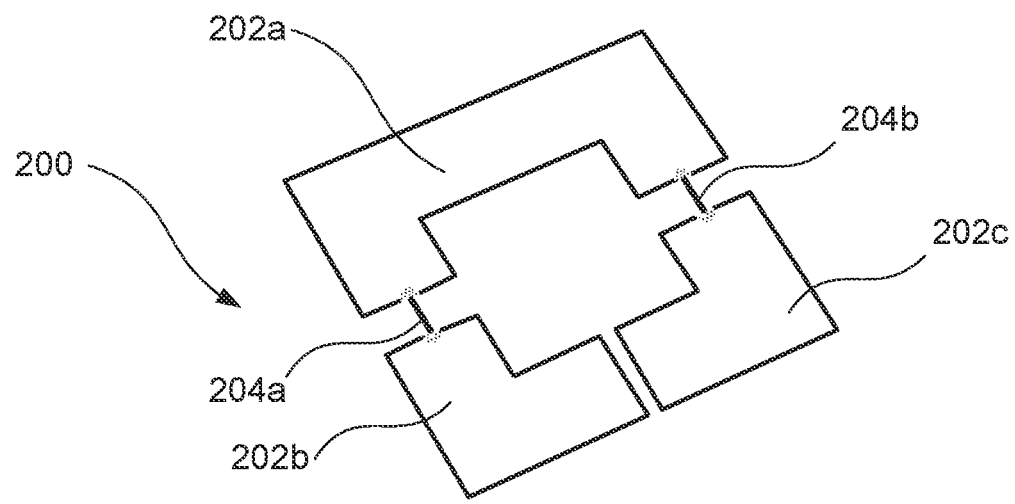
FIG. 2A is a schematic that illustrates a heat map plot of current density for an exemplary multiphysics simulation model of a SQUID geometry.

To ascertain the effects of a capping layer on noise, the magnetic field distribution of an exemplary square ring structure that resembles a SQUID was computed. FIG. 2A is a schematic that illustrates an exemplary primitive multiphysics simulation model of a SQUID geometry 200 that is sometimes used in superconducting qubits. The structure 200 includes regions 202a, 202b, and 202c, each of which corresponds to a superconductor region in an actual SQUID device. Structure 200 also includes regions 204a, 204b corresponding to Josephson junction leads in an actual SQUID device. While the SQUID structure illustrated in FIG. 2A includes two Josephson junctions, the subject matter of the present disclosure applies to SQUIDS with other numbers of junctions, such as, e.g., one-junction SQUIDS or three-junction SQUIDS. The geometry of the ring structure shown in FIG. 2A is square, with an approximately 4 μm inner radius and an approximately 8 μm outer radius. The square thus defined by the outer perimeter of structure 200 is 16 μm×16 μm. Each junction 204a, 204b is 2 μm in length and 0.25 μm in width. The superconductor regions and Josephson junctions were defined as having a 0.1 μm thickness on a dielectric substrate. The region 210 at the bottom between the electrodes represents where the COMSOL port is defined, e.g. where the current is injected for the model simulation. Because this port is small, and across the entire width of the electrode, the effect of the port on the simulation is minimal. A current density plot for the metal however shows this region 210 as white, as there's no actual metal in the port region in the model simulation. The separation between the electrodes, or port width is 0.5 um for the model. A heat map depicting the current density through different regions of the structure 200 is also illustrated in FIG. 2A. The heat map depicts that for this particular structure, current density is highest in the Josephson junction regions 204a, 204b.

Figure 2B:
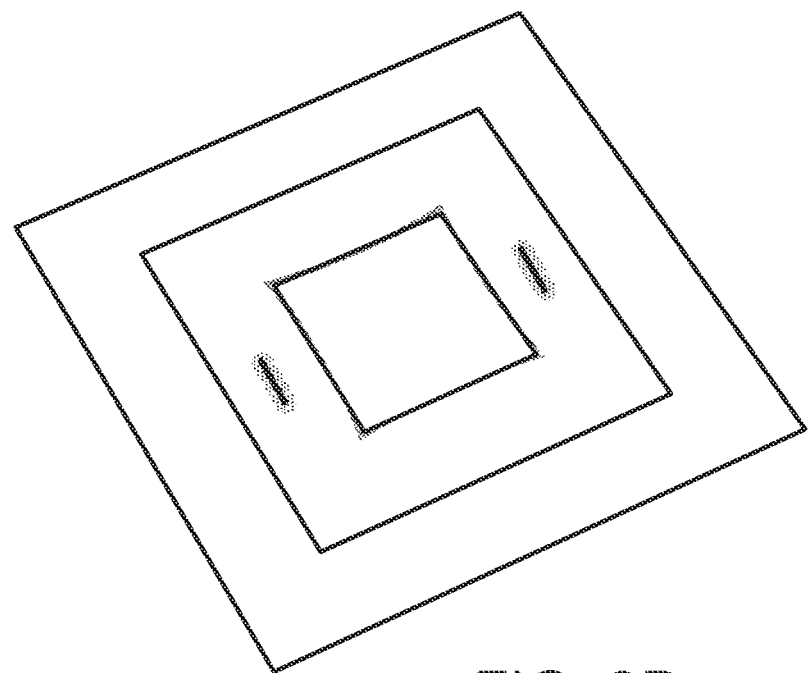
FIG. 2B is a heat map plot of the magnetic field strength for the model illustrated in FIG. 2A.

The magnetic field strength (|B|) in the plane of the interface between the substrate and the superconductor layer forming regions 202a, 202b, and 202c was computed for the structure 200 and is illustrated as a heat map plot in FIG. 2B. As can be seen from the plot in FIG. 2B, |B| also is highest in the regions where the Josephson junction regions 204a, 204b are located, but relatively lower in other areas of the SQUID.

The surface integral of $|B|^2$, also referred to as the magnetic field energy, for the structure 200 illustrated in FIG. 2A was computed and provides the noise "fingerprint" of the structure 200. The calculation of magnetic field energy was also performed for variations of the structure 200 in which a dielectric capping layer was provided on the surface of structure 200. The dielectric capping layer was modeled as a surface floating directly above the ring-like structure 200. The capping layer was modeled to cover the entirety of the structure shown in FIG. 2A and have a top layer that is affected by the same surface density of adsorbates as the structure 200 without the capping layer.

Figure 2C:
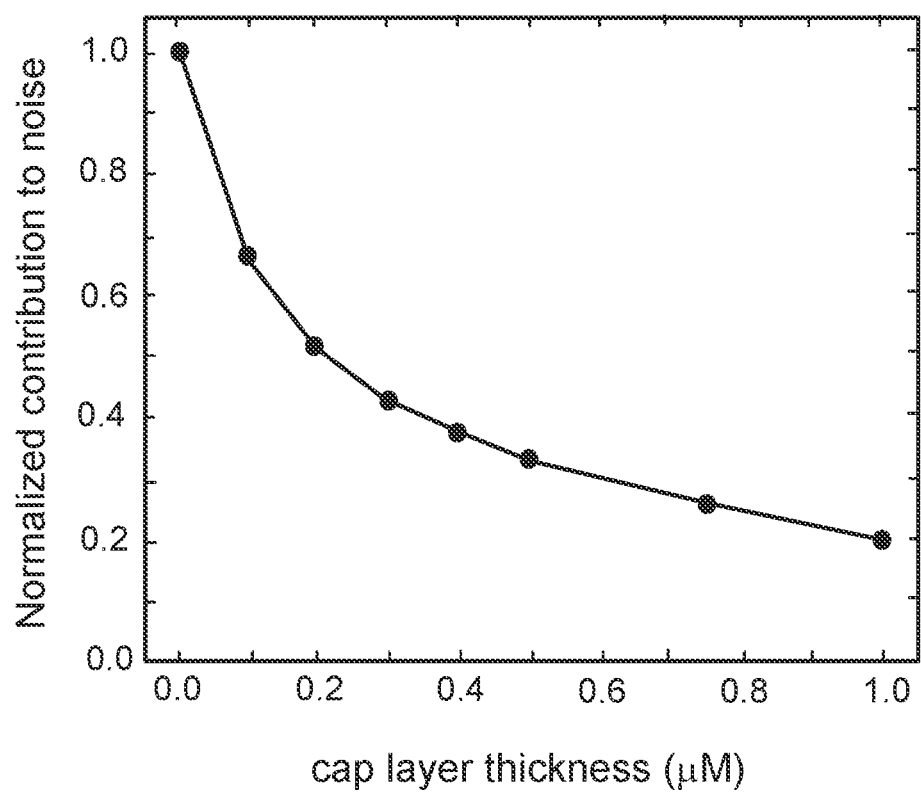
FIG. 2C is a plot that shows the contribution to noise normalized to the noise contribution without a capping layer versus capping layer thickness.

The results of the calculation are shown in the plot FIG. 2C. In particular, FIG. 2C is a plot that shows the contribution to noise (the integral of $|B|^2$ over all the surfaces that are exposed, e.g., exposed to vacuum or to air) normalized to the noise contribution without a capping layer versus capping layer thickness. Thus, for the condition where there is no capping layer present, the Josephson junction regions 204a, 204b and the surfaces of the superconductor regions 202a, 202b, and 202c are exposed. The relative permeability of the simulated capping layer was set to 1, e.g., equal to vacuum, which is appropriate for dielectric materials such as $SiO_x$. Other dielectric materials also may be used for the dielectric, such as silicon nitride or silicon. As shown in the plot, the simulated geometries indicate that a capping layer that is 0.5 μm thick may reduce the dephasing noise contribution by approximately a factor of about 3. Moreover, a capping layer with a thickness of 1 μm may reduce the contribution to noise by approximately a factor of about 5. Thus, the results of the simulation suggest that increasing a capping layer thickness on a SQUID structure may help reduce a total surface energy associated with the SQUID structure, though the magnitude of reduction may eventually decrease with increasing thickness. That is, the thicker the capping layer, the further the exposed top layer is from where magnetic fields are high—hence the reduction in contribution to noise.

Figure 3A:
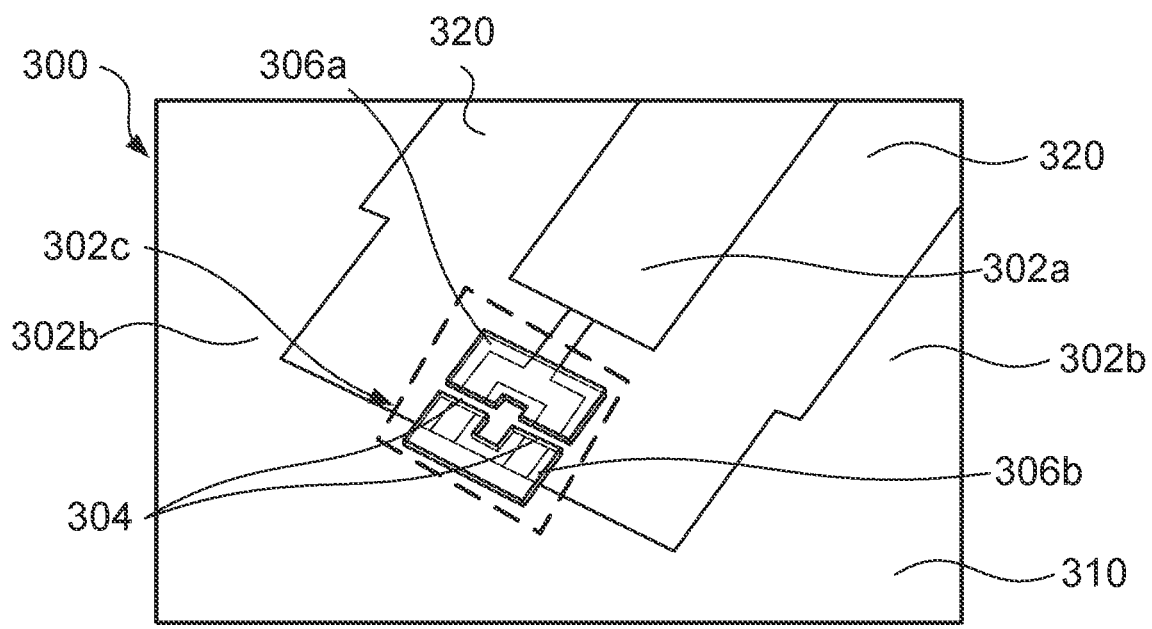
FIG. 3A is a schematic that illustrates an exemplary type of structure for reducing dephasing.

Next, different geometries of the capping layer with selective portions removed, were investigated using multiphysics simulation models. FIG. 3A is a schematic that illustrates an exemplary type of structure 300 for reducing dephasing that was investigated with simulation models. The structure 300 includes a layer of superconductor material 310 formed on a dielectric substrate 320. The superconductor material 310 may include, e.g., aluminum. The superconductor material 310 is patterned to form a co-planar waveguide section 302a, a ground plane section 302b and a SQUID section 302c. The superconductor material in the SQUID section 302c is patterned in a square-shaped ring and includes two Josephson junctions 304, where the width of the superconductor material substantially narrows and is interrupted by an oxide layer forming the junction. That is, the superconductor trace transitions from a first width to a second width at an area where the superconductor trace contacts the Josephson junction, in which the first width is greater than the second width. While the SQUID section 302c illustrated in FIG. 3A includes two Josephson junctions, the subject matter of the present disclosure applies to SQUIDS with other numbers of junctions, such as, e.g., one-junction SQUIDS or three-junction SQUIDS.

On top of the superconductor material in the SQUID section 302c, a first exemplary type of dielectric capping layer structure 306 is formed. In the example shown in FIG. 3a, the capping layer 306 is provided in two physically separate portions 306a, 306b. The arrangement of the capping layer 306 in FIG. 3A is referred to as a ring-like shape because it has a shape akin to a ring or approximately circular band, with the exception that the ring has been separated in half. The two halves 306a, 306b of the ring in FIG. 3A cover regions where high magnetic fields (relative to electric fields) and low electric fields (relative to the magnetic fields) are expected to occur (e.g., the inductor portion of the SQUID). The regions where the capping layer is not present correspond to areas where a low magnetic field (relative to the electric fields) and high electric field (relative to the magnetic fields) are expected to occur (e.g., the Josephson junctions of the SQUID and the inner region of the ring where only the substrate is located). The regions of the SQUID where the capping layer is absent (e.g., where there is an opening in the capping layer) may not have any material formed on their surface. For example, the regions of the SQUID where the capping layer is absent and an opening is formed may be exposed to vacuum during operation of the qubit.

When biasing a qubit for typical operation, the magnetic field enclosed by the SQUID, such as the SQUID shown throughout the present disclosure, is typically on the order of $(\frac{1}{4})\Phi_0$, with $\Phi_0$ the flux quantum. For the model shown in FIG. 3A, the inner area here may be expressed as 8 μm×8 μm (4 μm inner radius), so a typical B field inside the SQUID loop may be expressed as $B=(\frac{1}{4})\Phi_0/(8 \text{ μm}*8 \text{ μm})$ or approximately 10 μT.

As shown in FIG. 3A, the capping layer may extend beyond the edges of the superconductor material and cover portions of the substrate as well. For example, the capping layer may extend beyond the edges of the superconductor layer to overlap the dielectric substrate by about 0.1 to about 10 microns. As also shown in FIG. 3A, the dielectric capping layer covers the portions of the superconductor trace having the first wide width, while not covering the portions of the superconductor trace directly connected to the Josephson junctions having the second narrower width.

The structure 300 shown in FIG. 3A is only one type of capping layer structure that can be formed to reduce dephasing without significantly increasing energy loss in a circuit element, such as a qubit. Various other structures were analyzed and are shown in FIGS. 4A-4C.

Figure 3B:
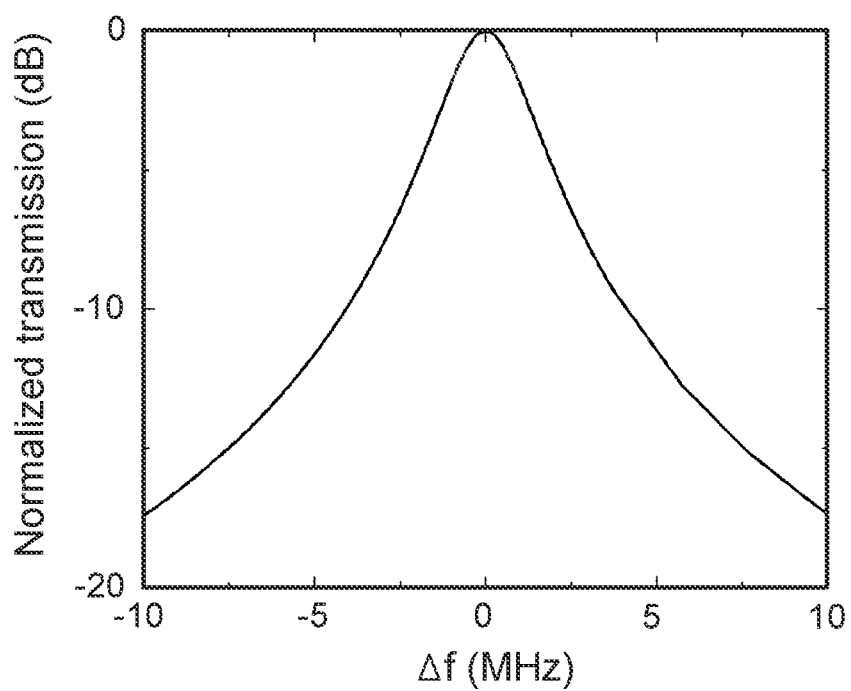
FIG. 3B is a plot of loss (in dB) versus frequency for the simulation model illustrated in FIG. 3A.

A quality factor, Q, which is indicative of the rate of energy loss to stored energy of a resonator, was also calculated for the structure 300 shown in FIG. 3A. The quality factor was extracted from the transmission of the circuit structure. FIG. 3B is a plot illustrating exemplary transmission loss (dB) (normalized to the insertion loss of qubit couplers) versus frequency for the simulation model illustrated in FIG. 3A. For calculating the quality factor, the thickness of the dielectric capping layer was assumed to be 1 micron and the loss tangent was assumed to be $1*10^{-3}$. The Q factor may, in some implementations, be expressed as $Q=f_{peak}/\Delta f_{3dB}$, where $f_{peak}$ is the frequency at the peak transmission value, and $\Delta f_{3dB}$ is the frequency separation between the points of the transmission plot that are 3 dB lower than the peak transmission value at $f_{peak}$. As seen from FIG. 3B, the structure 300, which utilizes a ring-like capping layer has $f_{3dB}$ occurring at less than 5 MHz for $f_{peak}$=5.3 GHz.

Figure 4A:
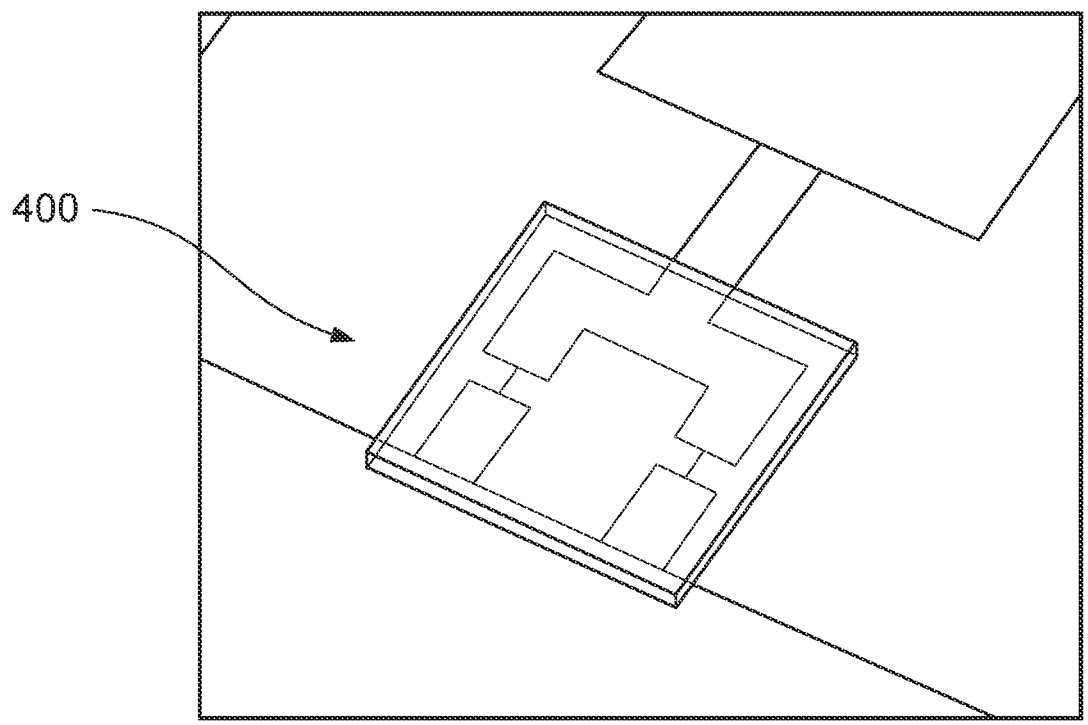
FIG. 4A is a schematic that illustrates a second exemplary type of capping layer structure for reducing dephasing.
Figure 4B:
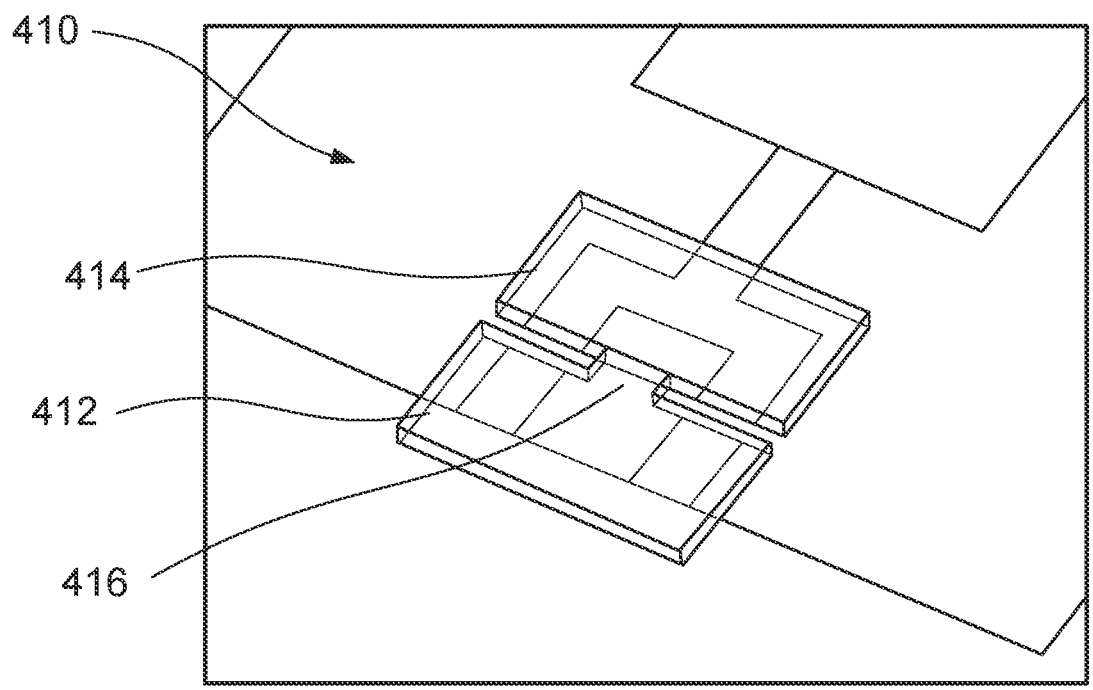
FIG. 4B is a schematic that illustrates a third exemplary type of capping layer structure for reducing dephasing.
Figure 4C:
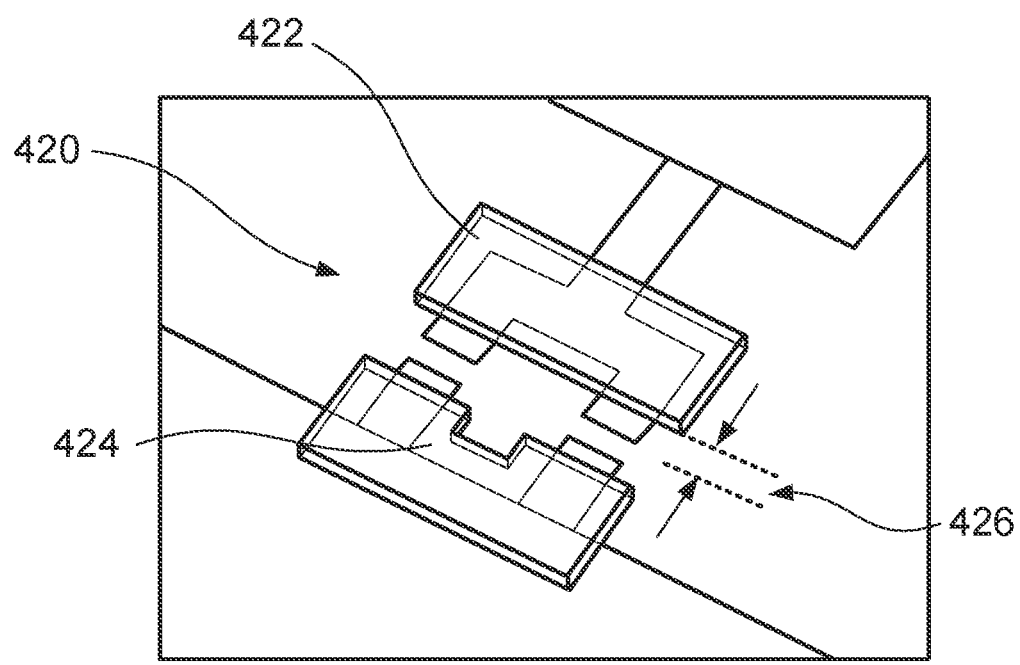
FIG. 4C is a schematic that illustrates a fourth exemplary type of capping layer structure for reducing dephasing.

FIGS. 4A-4C are schematics illustrating examples of other capping layer structures that were evaluated for reducing qubit dephasing. In each example, a dielectric capping layer covers at least a portion of a SQUID structure located beneath. The SQUID structure and dimensions depicted in FIGS. 4A-4C are the same as that described above with respect to FIGS. 2A and 3A, though the capping layers described herein may be used with other type of SQUID structures as well.

FIG. 4A is a schematic that illustrates a second exemplary type of capping layer structure 400 for reducing dephasing that was investigated with simulation models. The capping layer structure 400 is referred to as the "full" structure in which the dielectric capping layer 400 fully covers a SQUID, including the superconductor ring and Josephson junctions. In the example shown in FIG. 4A, the capping layer extends beyond the outer edges of the superconductor ring structure of the SQUID by 2 μm. Other implementations of the "full" capping layer design are also possible. For example, in some implementations, no portion of the capping layer extends beyond the edges of the underlying superconductor layers. For instance, the dielectric capping layer may extend right up to the edges of the underlying superconductor layer. In some implementations, the capping layer extends 1 μm, 4 μm, 8 μm, 10 μm, 15 μm, 20 μm, 25 μm, or 50 μm, among other distances beyond the outer edge of the underlying superconductor layer.

FIG. 4B is a schematic that illustrates a third exemplary type of capping layer structure 410 for reducing dephasing. The capping layer structure 410 is referred to as the "ring-like with center" structure. In this design, the capping layer 410 is provided as two rectangular regions 412, 414 that cover a first section of the SQUID containing the superconductor material and a second section of the SQUID containing the superconductor material, respectively. Thus, regions 412, 414 cover areas where magnetic fields are high relative to the low electric fields, but low relative to the magnetic fields in the junction regions, are expected to occur (e.g., the inductor portion of the SQUID). The two rectangular regions 412, 414 of the capping layer 410 are connected at their centers to one another by a connecting portion 416 of dielectric material. The capping layer connecting portion 416 covers just the upper surface of the substrate encircled within the SQUID ring, but is not shown covering any superconductor regions. This structure leaves the Josephson junctions of the SQUID exposed through an opening on either side of the center dielectric portion 416. That is, just the regions containing the narrow superconductor contacts and the junction oxide as well as a thin portion of the substrate extending between the junction contacts are exposed/uncovered. These are regions where the contribution to noise is less than the contribution to microwave loss due to the relatively high electric fields. The distance between regions 412, 414 in these areas is 2 microns. Though shown covering only some of the underlying substrate region encircled by the SQUID ring, the center portion 416 may have different areas. For example, the area of the center portion may be so large as to extend to each Josephson junction.

FIG. 4C is a schematic that illustrates a fourth exemplary type of capping layer structure 420 for reducing dephasing. The capping layer structure 420 is referred to as the "pull-back" structure. In this structure 420, the capping dielectric layer is again formed in two separate portions 422, 424, each of which covers regions where magnetic fields are high relative to the electric fields, but low relative to the magnetic fields of the junctions, are expected to occur (e.g., the inductor portion of the SQUID). The regions where the capping layer is not present (e.g., where an opening in the capping layer is formed) primarily correspond to areas where a magnetic field is low relative to the electric field, but high relative to the magnetic field in other areas of the SQUID, are expected to occur (e.g., the Josephson junctions of the SQUID and the inner region of the ring where only the substrate is located). In contrast to the ring-like structure, however, the pulled back structure has the capping layer pulled back from the edges near the Josephson junctions, e.g., where the superconductor material transitions from being relatively wide to relatively narrow, leaving a terminal portion of the wide superconductor layer uncovered. Furthermore, while one portion 422 is shown as a rectangular in shape, and a second portion 424 is shown as rectangular in shape with a notch (similar to regions 306a or 306b), the "pull-back" capping layer design is not limited to these particular shapes. For example, in some implementations, the pull-back design may employ two rectangular shaped sections facing one another, or two half-ring shaped sections facing one another, among other designs.

In example configurations of the pull-back structure, the superconductor material underlying the capping layer transitions from having a width understood as being approximately orthogonal to a direction of current travel through the superconductor layer) of between about 1 to about 5 microns in the wide areas away from the Josephson junction to having a width of about 0.4 microns to about 0.05 microns in the narrow areas near the Josephson junctions. In the pulled-back configuration, the distance 426 that the capping layer is pulled back from where the superconductor layer transitions from wide to narrow may be, e.g., between about 0.05 microns to about 10 microns, for instance, the distance 426 may be about 6 microns.

For simulation of the different capping layer structures (e.g., structures shown in FIGS. 3 and 4A-4C), a dielectric loss of $10^{-3}$ was used, which can be scaled to realistic values of loss tangents for a variety of deposited dielectrics. The capping layer thickness was assumed to be constant for each structure at 1 µm. T1 values were calculated for the different structures at a frequency of 5 GHz and for different loss tangents. T1 may be understood as indicative of the energy coherence time of a resonator structure, such as those found in qubits. T1 times higher than 30-50 micros microseconds, such as higher than 250 microseconds, are advantageous for construction of quantum computing systems. The different tangents are representative of different dielectric materials used as the capping layer. For example, a loss tangent of $1*10^{-3}$ is representative of silicon oxide, a loss tangent of $2*10^{-4}$ is representative of silicon nitride, and a loss tangent of $2*10^{-5}$ is representative of deposited amorphous silicon.

The T1 values calculated for the four different capping layer geometries are illustrated in TABLE 1 below, where the first column refers to the particular capping layer structure analyzed. The third row of TABLE 1 corresponds to the "ring-like" structure of FIG. 3. As an example, Table I shows that fully capping the SQUID ("Full") with a dielectric with a loss tangent of $2*10^{-4}$ gives a T1 of 24 µs.

TABLE I

| Coverage | T1 @ $1*10^{-3}$ (SiO$_x$) (µs) | T1 @ $2*10^{-4}$ (SiN) (µs) | T1 @ $2*10^{-5}$ (Si) (µs) |
| --- | --- | --- | --- |
| Full (FIG. 4A) | 5 | 24 | 240 |
| Two-halves with center connected (FIG. 4B) | 11 | 56 | 560 |
| Ring-like (FIG. 3A) | 12 | 64 | 640 |
| Pulled back (FIG. 4C) | 19 | 95 | 950 |

As shown in TABLE 1, by selectively forming a dielectric capping layer on the SQUID, it is possible to reduce the loss associated with the dielectric and improve coherence times. The more dielectric material that is removed, longer coherence times can be achieved. For example, for the pulled back structure formed of silicon, the simulation results suggest a T1 of 950 microseconds is possible, whereas when the full structure is used, the coherence time is reduced by almost a factor of four.

Figure 5A:
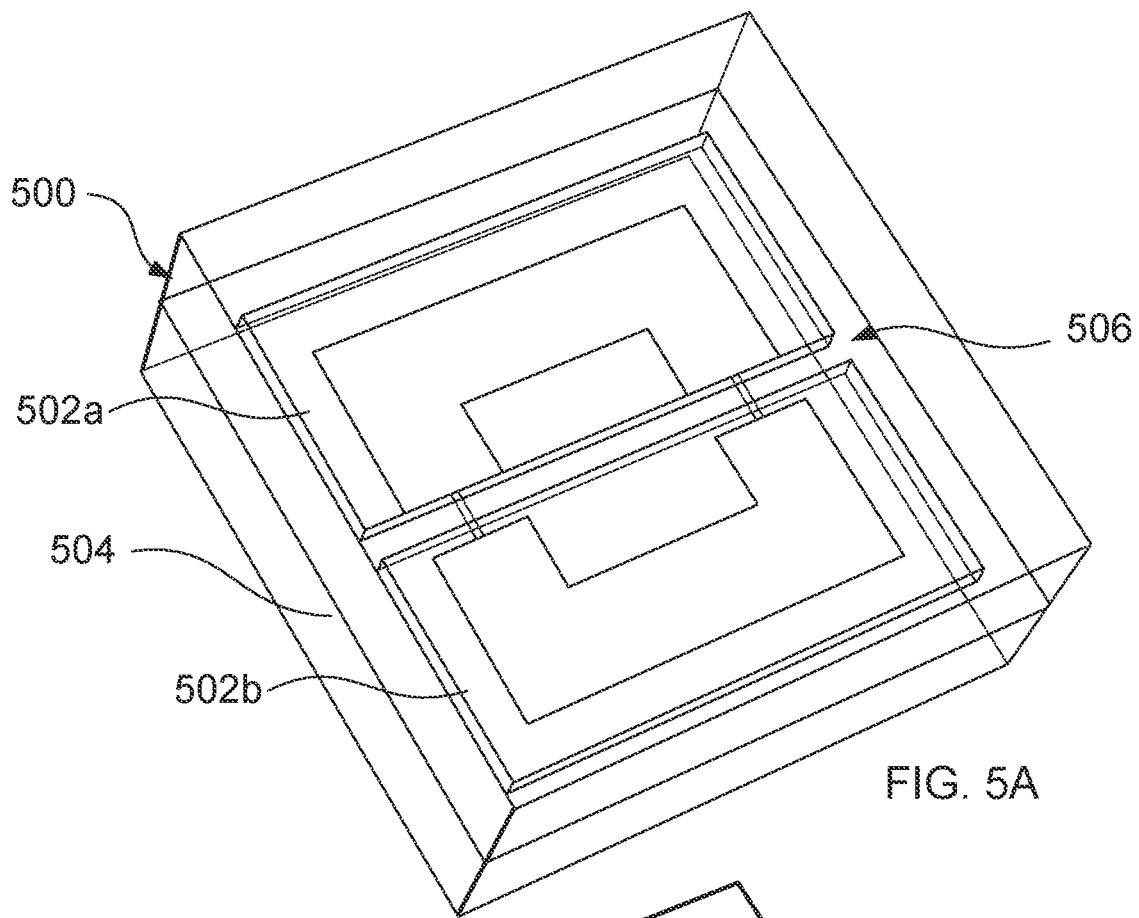
FIG. 5A is a schematic that illustrates a fifth exemplary type of capping dielectric layer structure for reducing dephasing.

FIG. 5A is a schematic that illustrates a fifth exemplary type of capping dielectric layer structure 500 for reducing dephasing. The capping layer 500 includes a first portion 502a and a second portion 502b covering a SQUID structure formed on a dielectric substrate. The SQUID structure in FIG. 5A is the same as that described herein with respect to FIGS. 2-4. As explained herein, the substrate may include a dielectric such as silicon or sapphire, whereas the capping layer may include dielectric materials such as, e.g., silicon oxide, silicon (e.g., amorphous silicon) or silicon nitride. In contrast with other capping layer designs described herein, portions 502a, 502b are separated from one another by a narrow constant width gap 506. The gap thus leaves exposed (e.g., to air or vacuum) the Josephson junctions and, in some cases, portions of the superconductor layer. To evaluate this particular capping layer design, the structure was simulated with a capping layer dielectric thickness of 1 µm thick, and a width of the narrow gap 506 equal to 1.2 µm so that 60% of the narrow Josephson junction leads connecting portions 502a and 502b are exposed. A film thickness for the superconductor layer was set to 100 nm. Other values may be used instead. For example, the width of gap 506 can be 1 µm, 1.5 µm, 2 µm, 3 µm, among other values. Similarly, the cap layer thickness and superconductor thickness can vary as well.

Figure 5B:
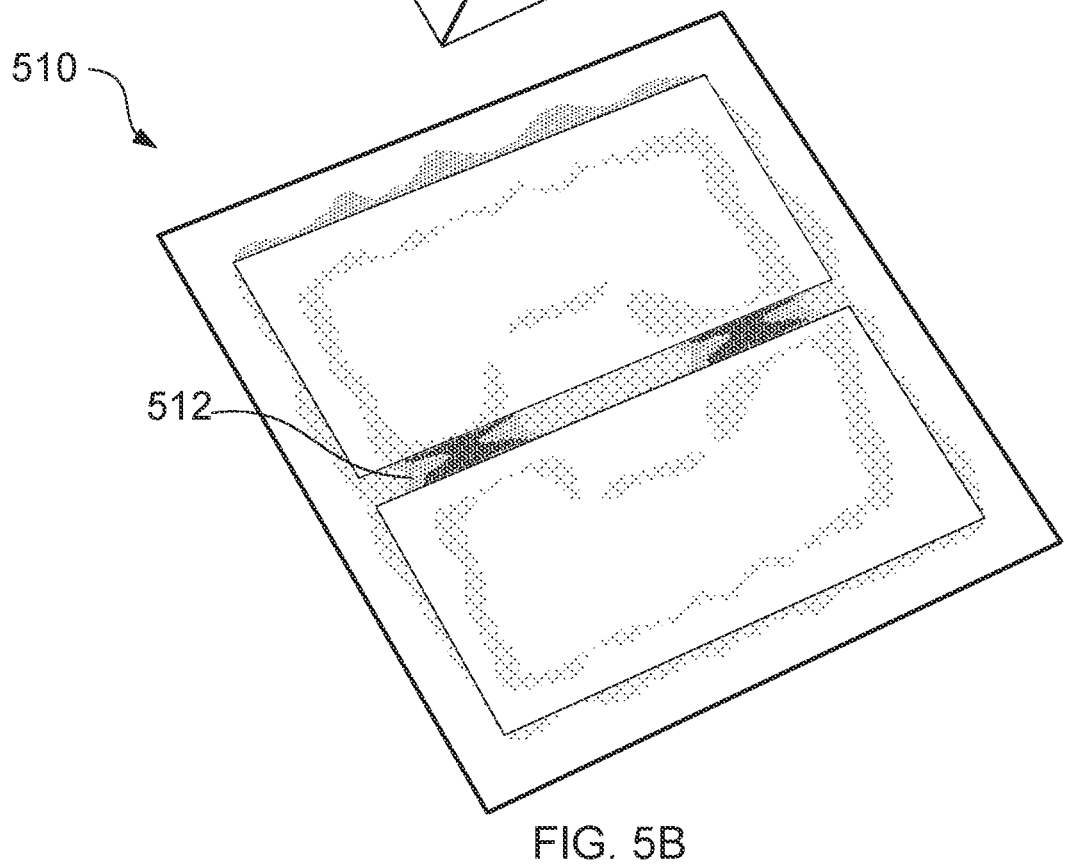
FIG. 5B is a schematic that illustrates an example of a heat map depicting the magnitude of the electric field (|E|) in a plane extending through the capping layer of the structure of FIG. 5A at a location a little more than half the thickness of the capping layer (at z=0.6 µm above substrate surface).

FIG. 5B is a schematic that illustrates an example of a heat map depicting the magnitude of the electric field (|E|) in a plane extending through the capping layer at a location a little more than half the thickness of the capping layer (at z=0.6 µm above substrate surface). As seen in the heat map of FIG. 5B, the E fields are relatively higher above the junction area.

Figure 5C:
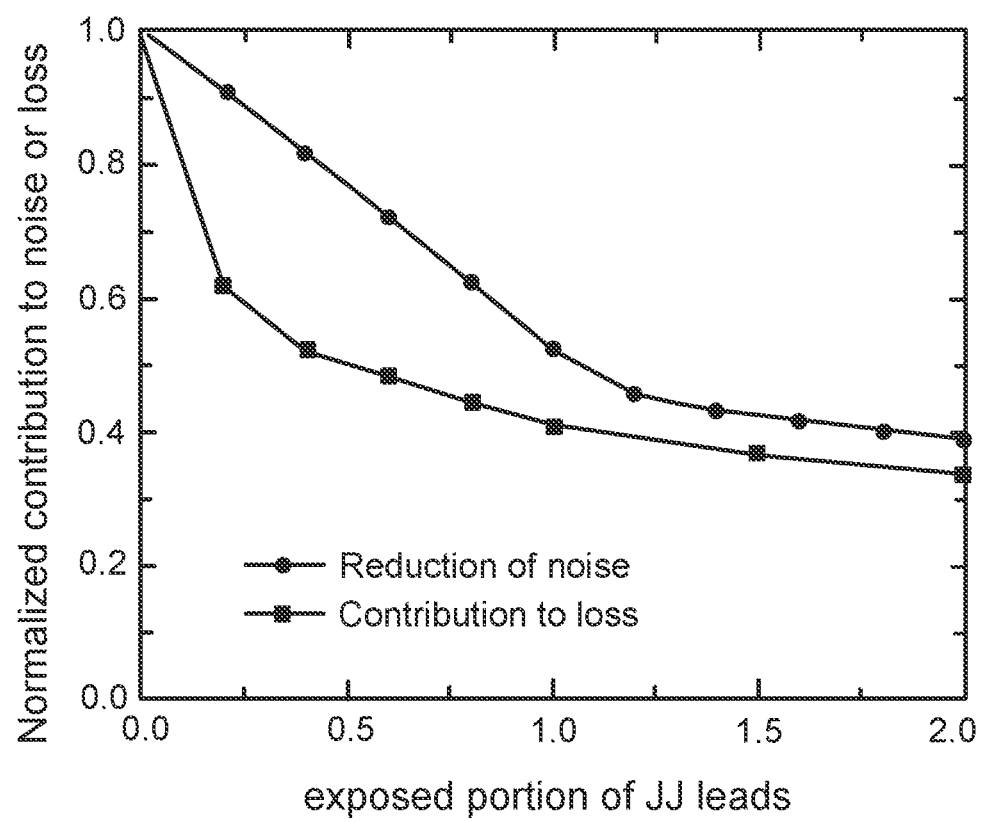
FIG. 5C is a plot that depicts the contribution to noise or loss as a function of the amount of the Josephson junction leads that are left exposed without a capping layer.

FIG. 5C is a plot that depicts the contribution to loss as well as the reduction in noise (the integral of |B|$^2$ over all the surfaces that are exposed, e.g., exposed to vacuum or to air) or loss as a function of the portion of the Josephson junction leads that are left exposed without a capping layer. That is, x=0.6 would correspond to 60% exposure as shown in FIG. 5A, whereas for values of x>1, the part of the SQUID attached to the leads (e.g., portions 502a, 502b) becomes uncovered/exposed. As can be seen from the plot, as more of the Josephson junction leads are exposed, the capping layer is less effective to reducing noise because it does not fully cover the Josephson junctions (e.g., effectiveness is reduced to about 72% when the exposed portion equals 0.6). On the other hand, as more of the Josephson junction leads are exposed, the contribution of the capping layer to loss is reduced because near the high E fields the cap layer is removed. For example, when the exposed portion equals 0.6, the normalized loss is reduced to 48%.

The techniques disclosed herein provide a feasible way to reduce dephasing without incurring a significant penalty in qubit energy loss. Capping layers, such as the structures disclosed herein, may be applied to various different superconducting qubits, such as xmon qubits, gmon qubits, or fluxmon qubits.

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements and quantum information processing devices) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

As an example, the structures described herein may be fabricated by providing a dielectric substrate, such as silicon or sapphire, and then depositing a layer of superconductor material, such as aluminum, on the substrate using, e.g., physical vapor deposition. The superconductor layer may be patterned (e.g., through lift-off and/or etching). One or more dielectric layers (e.g., silicon oxide) may be formed on the patterned superconductor layer. In some cases, an additional superconductor layer then is deposited and patterned on the previously deposited superconductor layer and/or oxide to define a circuit element, such as a quantum computing circuit element, and more specifically, such as a qubit, including a qubit that has a superconducting quantum interference device (SQUID). A dielectric capping layer then may be deposited (e.g., using physical vapor deposition) on the circuit element. In some implementations, the dielectric capping layer may be patterned (e.g., using lift-off and/or etching) to define one or more regions where the underlying circuit element is to be exposed. For example, the capping layer may be patterned and removed to expose at least one Josephson junction. In some implementations, the capping layer may be patterned to form one of the capping layer designs described herein, such as the designs depicted in FIGS. 2, 3, 4A-4C, and 5A.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin), niobium (superconducting critical temperature of 9.3 kelvin), and titanium nitride (superconducting critical temperature of 5.6 kelvin).

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations of the invention have been described. Nevertheless, it will be understood that various modifications may be made without departing from the spirit and scope of the invention. Accordingly, other implementations are within the scope of the following claims.

What is claimed is:

1. A method of fabricating a device, the method comprising:
   obtaining a substrate;
   forming a superconducting quantum interference device (SQUID) on an upper surface of the substrate, wherein the SQUID comprises a superconductor trace and at least one Josephson junction interrupting a path of the superconductor trace;
   forming a dielectric capping layer on an upper surface of the SQUID; and
   patterning the dielectric capping layer to create an opening through which a first region of the SQUID is exposed, the first region of the SQUID comprising a first Josephson junction, wherein the dielectric capping layer covers a majority of the superconductor trace of the SQUID.

2. The method of claim 1, comprising patterning the dielectric capping layer to create an additional opening through which a second region of the SQUID is exposed, the second region of the SQUID comprising a second Josephson junction.

3. The method of claim 1, wherein the dielectric capping layer has a non-zero thickness of 1 micron or less.

4. The method of claim 1, wherein the dielectric capping layer extends beyond an edge of the superconductor trace to overlap the substrate by about 0.1 microns to about 10 microns.

5. The method of claim 1, wherein the SQUID is arranged in a ring, and
wherein patterning the dielectric capping layer comprises forming a first capping layer portion, a second capping layer portion, and a connecting portion connecting the first capping layer portion to the second capping layer portion,
wherein the connecting portion of the dielectric capping layer covers an interior region enclosed by the ring.

6. The method of claim 5, wherein the connecting portion of the dielectric capping layer covers an entirety of the interior region enclosed by the ring.

7. The method of claim 5, wherein the opening comprises a first section on a first side of the connecting portion and second section on a second opposite side of the connecting portion,
wherein the first Josephson junction is exposed through the first section of the opening, and
wherein a second Josephson junction is exposed through the second section of the opening.

8. The method of claim 1, wherein the SQUID is arranged in a ring, and
wherein patterning the dielectric capping layer comprises forming a first capping layer portion and a second capping layer portion,
wherein the opening is located between the first capping layer portion and the second capping layer portion.

9. The method of claim 8, wherein the first capping layer portion is entirely separated from the second capping layer portion.

10. The method of claim 8, wherein each of an edge of the first capping layer portion and an edge of the second capping layer portion extends up to but does not cover the first Josephson junction.

11. The method of claim 10, wherein the device comprises a second Josephson junction exposed in the opening in the dielectric capping layer, and
wherein each of the edge of the first capping layer portion and the edge of the second capping layer portion extends up to but does not cover the second Josephson junction.

12. The method of claim 8, wherein an edge of the first capping layer portion nearest the first Josephson junction and an edge of the second capping layer portion nearest the first Josephson junction are set back from the first Josephson junction.

13. The method of claim 1, wherein the dielectric capping layer is silicon oxide, silicon nitride or silicon.

14. The method of claim 1, wherein the device is a qubit.

15. The method of claim 1, wherein the substrate is silicon or sapphire.

* * * * *